(12) United States Patent
Chang

(10) Patent No.: US 7,382,650 B2
(45) Date of Patent: Jun. 3, 2008

(54) METHOD AND APPARATUS FOR SECTOR ERASE OPERATION IN A FLASH MEMORY ARRAY

(75) Inventor: Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 57 days.

(21) Appl. No.: 11/538,408

(22) Filed: Oct. 3, 2006

(65) Prior Publication Data

US 2008/0084765 A1     Apr. 10, 2008

(51) Int. Cl.
*G11C 16/04* (2006.01)
*G11C 11/34* (2006.01)
*G11C 8/00* (2006.01)

(52) U.S. Cl. .................. 365/185.11; 365/185.18; 365/174; 365/182; 365/230.03

(58) Field of Classification Search .............. 365/174, 365/185, 230.03, 185.11, 185.18
See application file for complete search history.

(56) References Cited

U.S. PATENT DOCUMENTS 6,831,860 B2 * 12/2004 Lee et al. .............. 365/185.11
2006/0083072 A1 * 4/2006 Umezawa .............. 365/185.29

* cited by examiner

*Primary Examiner*—Ly Duy Pham
(74) *Attorney, Agent, or Firm*—Ingrassia Fisher & Lorenz, P.C.

(57) ABSTRACT

A memory device is provided which includes a substrate, a common P-well isolated from the substrate, a plurality of sectors, and a common sector selection transistor configured to select one of the sectors for erasure. Each of the sectors share the same common sector select transistor, and the common P-well. The selected sector is configured to be erased by applying appropriate voltages to the selected sector.

16 Claims, 7 Drawing Sheets

METHOD AND APPARATUS FOR SECTOR ERASE OPERATION IN A FLASH MEMORY ARRAY

TECHNICAL FIELD

Embodiments of the present invention relate generally to flash memory devices. More particularly, embodiments of the present invention relate to sector erase operations for flash memory devices.

BACKGROUND

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory cell, such as a flash memory unit.

One conventional flash memory technology is based upon a memory cell that utilizes a charge trapping dielectric cell that is capable of storing two bits of data. One example of this type of non-volatile memory device is known as a dual-bit Flash electrically erasable and programmable read-only memory (EEPROM), which is available under the trademark MIRRORBIT™ from Spansion, Inc., Sunnyvale, Calif. Such dual-bit memory cells utilize a single silicon nitride layer having two separate charge storage regions to store charge within the silicon nitride layer. In such an arrangement, one bit can be stored using a first charge storing region on one side of the silicon nitride layer, while a second bit can be stored using a second charge storing region on the other side of the same silicon nitride layer. For example, a left bit and right bit can be stored in physically different areas of the silicon nitride layer, near left and right regions of each memory cell, respectively. In comparison to a conventional EEPROM cell, a dual-bit memory cell can store twice as much information in a memory array of equal size.

FIG. 1 is a cross-sectional view of a conventional dual-bit memory cell 50. The memory cell 50 has a dual-bit (bit1, bit2) architecture that allows twice as much storage capacity as a conventional EEPROM memory device.

The conventional memory cell 50 includes a substrate 54, a first insulator layer 62 disposed over the substrate 54, a nitride charge storage layer 64 disposed over the first insulator layer 62, a second insulator layer 66 disposed over the charge storage layer 64, and a polysilicon control gate 68 disposed over the second insulator layer 66. To produce an operable memory device, a first metal silicide contact (not shown) can be disposed on substrate 54, and the control gate 66 can be capped with a second metal silicide contact (not shown).

In one implementation, the substrate 54 is a P-type semiconductor substrate 54 having a first buried junction region 60 and a second buried junction region 61 formed within substrate 54 in self-alignment with the memory cell 50. First buried junction region 60 and second buried junction region 61 are each formed from an N+ semiconductor material. The first insulator layer 62, the charge storage layer 64, and the second insulator layer 66 can be implemented using an oxide-nitride-oxide (ONO) configuration in which a nitride charge storage layer 64 is sandwiched between two silicon dioxide insulator layers 62, 66. Alternatively, charge storage layer 64 may utilize buried polysilicon islands as a charge trapping layer. The charge storage layer 64 is capable of holding a charge.

Memory cell 50 can store two data bits: a left bit represented by the circle (bit 1); and a right bit represented by the circle (bit 2). In practice, memory cell 50 is generally symmetrical, thus first buried junction region 60 and second buried junction region 61 are interchangeable. In this regard, first buried junction region 60 may serve as the source region with respect to the right bit (bit 2), while second buried junction region 61 may serve as the drain region with respect to the right bit (bit 2). Conversely, second buried junction region 61 may serve as the source region with respect to the left bit (bit 1), while first buried junction region 60 may serve as the drain region with respect to the left bit (bit 1). A threshold voltage exists between the control gate 66 and the substrate 54 to prevent leakage during functioning of the device.

While a single dual-bit memory cell 50 is illustrated in FIG. 1, it will be appreciated that any suitable number of the dual-bit memory cells 50 could be used to form a memory array, as described below with reference to FIG. 2.

FIG. 2 is a simplified diagram of a plurality of dual-bit memory cells arranged in accordance with a conventional array architecture 200 (a practical array architecture can include thousands of dual-bit memory cells 50). Array architecture 200 includes a number of buried bit lines formed in a semiconductor substrate as mentioned above. FIG. 2 depicts three buried bit lines (BLs) 202, 204, and 206, each being capable of functioning as a drain or a source for memory cells in array architecture 200. Array architecture 200 also includes a number of word lines (WLs) correspond to the gate of the memory cells and are utilized to control the gate voltage of the memory cells. FIG. 2 depicts four WLs 208, 210, 212, and 214 that generally form a crisscross pattern with the bit lines. Although not shown in FIG. 2, charge storage layer, such as an ONO stack, resides between the BLs and the WLs. The dashed line circles in FIG. 2 represent two of the dual-bit memory cells in array architecture 200. Notably, BL 204 is shared by the dual-bit memory cells. Array architecture 200 is known as a virtual ground architecture because ground potential can be applied to any selected BL and there need not be any BLs with a fixed ground potential.

Control logic and circuitry (not shown) for array architecture 200 governs the selection of memory cells, the application of voltage to the WLs 208, 210, 212, 214, and the application of voltage to the BLs 202, 204, 206 during conventional flash memory operations, such as: programming; reading; erasing; and soft programming. Voltage is delivered to the BLs 202, 204, 206 using BL contacts 230. FIG. 2 depicts three conductive metal lines 220, 222, and 224 and three BL contacts 230. For a given BL 202, 204, 206, a BL contact is used once every 16 WLs because the resistance of the BLs 202, 204, 206 is very high.

FIG. 3 shows an array 300 of dual-bit memory cells comprising a number of core array sectors 320-350. Each of the core array sectors 320-350 comprises a number of BLs and WLs which form the dual bit memory cells as described in FIG. 2. Each core array sector 320-350 can be erased by selecting that particular sector for erasure, and applying appropriate voltages to a common P-well (not shown) in the substrate, BLs and WLs in the selected sector. To select a particular core array sector 320-350 to be erased, each of the core array sectors 320-350 has its own corresponding sector select transistor 310A-310D.

FIG. 4 shows an array 400 of dual-bit memory cells and the biasing used during a hot hole erase operation to erase a selected sector in the array 400. The array 400 of dual-bit memory cells comprises a plurality of sectors. Each sector comprises a number of WLs 410, 420 and a number of BLs 430, 440. All of the sectors share a common P-well 405.

When a particular sector is selected to be erased via a hot hole erase operation, a sector select transistor for that sector can be used to pass the required BL voltage to that particular sector. The selected core array sector can then be erased by applying a negative bias voltage $(-V_G)$, for example minus nine volts, to each of the WLs 410 in the selected sector, applying a positive BL voltage $(+V_B)$, for example nine volts, to each of the BLs 430 in the selected sector, grounding each of the WLs 420 and BLs 440 in the unselected sectors 330-350 at zero volts, and grounding the common P-well 405 at zero volts.

In the hot hole erase operation of FIG. 4, individual sector select transistors 310A-310D are required for each core array sector 320-350 to prevent an erase disturbance. Since each sector 320-350 needs a dedicate sector select transistor, valuable die area is consumed. Moreover, the erase disturbance can occur to the unselected sector during a hot hole erase operation of the selected sector because the positive BL voltage $(+V_B)$ on the BLs can generate undesired hot holes and can erase of the unselected sectors. Applying a positive BL voltage $(+V_B)$ to the selected BLs 430 and grounding the unselected BLs 420 can be achieved by controlling the different sector select transistors 310A and 310B-D between the sectors 320-350 of FIG. 3.

BRIEF SUMMARY

To conserve valuable die area, it would be desirable to reduce the number of sector select transistors used to erase a specific sector in a memory device comprising an array of multiple-bit per cell memory cells arranged in a number of sectors. For instance, it would be desirable eliminate the need for separate dedicated sector select transistors for each core array sector (e.g., have multiple sectors share one sector select transistor), while retaining the ability to erase each sector in a stable manner (e.g., without introducing erase disturbance issues).

The above and other aspects of the invention may be carried out in one embodiment by a method for erasing a selected sector in a memory device. The memory device comprising a plurality of sectors, a single common sector selection transistor shared by each of the sectors, and a common P-well shared by each of the sectors. The method of erasing may be carried out by selecting a particular one of the sectors for erasure via the single common sector selection transistor, and then applying appropriate voltages to the selected sector to erase the selected sector.

In one implementation, the memory device comprises a multiple-bit per cell memory array comprising a plurality of multiple-bit per cell memory cells. The multiple-bit per cell memory array comprises a plurality of bit lines and a plurality of word lines which form multiple-bit per cell memory cells of the memory device. Each of the sectors comprise a subset of the plurality of multiple-bit per cell memory cells, and can be defined by the bit lines and a number of the word lines. In this case, the selected sector can be erased by applying appropriate voltages to the common P-well, the bit lines and the number of word lines of the selected sector to erase the selected sector. For example, a negative bias voltage $(-V_G)$ can be applied to each of the number of word lines in the selected sector, each of the bit lines and the number of word lines in the unselected sectors can be left floating, and a positive bias voltage $(+V_{pwell})$ can be applied to all of the memory cells in the array via the common P-well.

The above and other aspects of the invention may also be carried out in another embodiment by a memory device is provided which comprises a substrate, a common P-well isolated from the substrate, a plurality of sectors, and a common sector selection transistor configured to select one of the sectors for erasure. Each of the sectors share the same common sector select transistor, and the common P-well. The selected sector is configured to be erased by applying appropriate voltages to the selected sector.

In one implementation, the memory device may comprise a multiple-bit per cell memory array comprising a plurality of bit lines and a plurality of word lines which form multiple-bit per cell memory cells of the memory device. Each sector includes a subset of the plurality of multiple-bit per cell memory cells, and comprises the bit lines and a number of the word lines. The selected sector can be erased by applying appropriate voltages to the common P-well, the bit lines and the number of word lines of the selected sector. For example, the selected sector can be erased by applying a negative bias voltage $(-V_G)$, to each of the number of word lines in the selected sector of the array such that the respective gates of the individual transistors in the selected sector are negatively biased; floating each of the number of word lines in unselected sectors of the array such that each of the respective gates of the individual transistors in the unselected sectors are left floating; floating each of the bit lines; and applying a positive bias voltage $(+V_{pwell})$ to all of the memory cells in the array via the common P-well. By applying the high positive bias voltage $(+V_{pwell})$ to the common P-well, the high positive bias voltage $(+V_{pwell})$ can be coupled through the word lines at the respective gates of the individual transistors such that the word lines in the unselected sectors of the array, and the common P-well are at the high positive bias voltage $(+V_{pwell})$. Each of bit lines are N+ junctions such that a forward bias couples the bit lines to the common P-well. The bit lines charge-up very close to the relatively high positive bias voltage $(+V_{pwell})$ on the common P-well such that the common P-well and the bit lines are sitting at essentially the same potential.

BRIEF DESCRIPTION OF THE DRAWINGS

A more complete understanding of the present invention may be derived by referring to the detailed description and claims when considered in conjunction with the following figures, where:

DETAILED DESCRIPTION

The following detailed description is merely illustrative in nature and is not intended to limit the embodiments of the invention or the application and uses of such embodiments. Furthermore, there is no intention to be bound by any expressed or implied theory presented in the preceding technical field, background, brief summary.

For the sake of brevity, conventional techniques related to transistor design and manufacturing, the control of flash memory devices, memory cell programming, memory cell erasing, memory cell soft programming, memory cell verification operations, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

Figure 5:
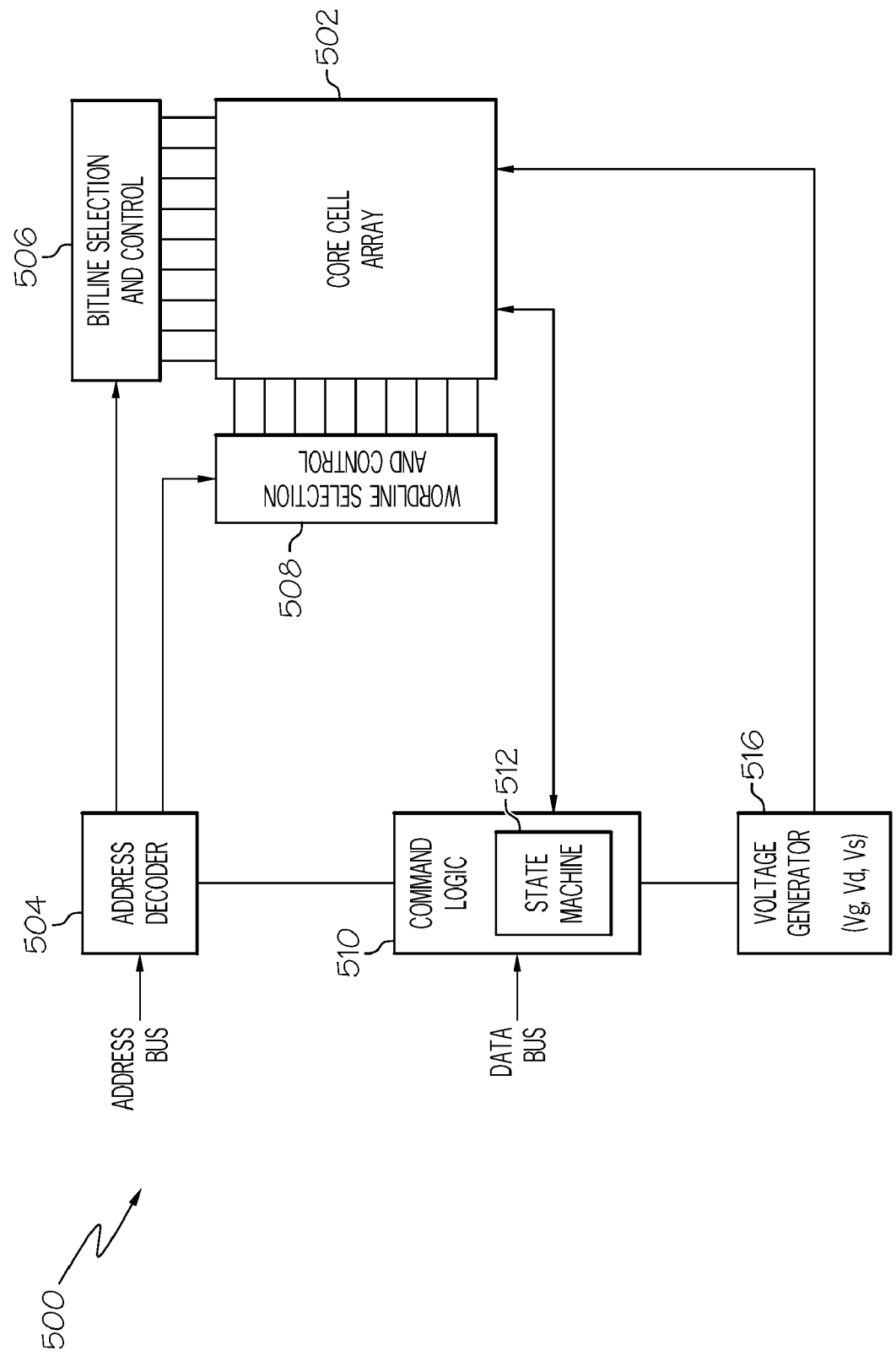
FIG. 5 is a schematic representation which shows a flash memory system.

FIG. 5 is a schematic representation of a flash memory system 500 configured in accordance with an example embodiment. System 500 is a simplified representation of an example embodiment, and an actual system 500 may include conventional elements, logic, components, and functionality not shown in FIG. 5. Briefly, system 500 is provided for performing programming, verifying, soft programming and erasing of a core cell array 502 that utilizes a virtual ground architecture. In this regard, the memory cells within core cell array 502 may be dual bit memory cells (see FIG. 1), single bit memory cells, or any suitably configured flash memory cells. In practical embodiments, core cell array 502 is partitioned into a plurality of sectors, where memory cells within a sector are grouped together via all the wordlines that share the same sector address. It is to be appreciated that core cell array 502 could be realized in any number of different configurations, for example, 128,000 sectors comprised of 16 normal bits and 16 complimentary bits on 16 cells. In addition, core cell array 502 may utilize any number of sectors (within practical limitations).

Flash memory system 500 includes an address decoder 504 coupled to core cell array 502 for decoding input and/or output ("I/O") signals during various operations that are performed on core cell array 502 (e.g., programming, reading, verifying, soft programming, erasing). In this example, address decoder 504 receives address bus information from a system controller (not shown) or the like. Address decoder 504 may be coupled to bitline selection and control logic 506, which is suitably configured to select one or more desired bitlines as needed to support the various flash memory operations described herein. Likewise, address decoder 504 may be coupled to wordline selection and control logic 508, which is suitably configured to select one or more desired wordlines as needed to support the various flash memory operations described herein. System 500 may leverage known addressing and switching techniques to select a desired target cell (or a plurality of target cells) in core cell array 502 for programming, soft programming, reading, erasing, program verification, erase verification, soft program verification, etc.

Flash memory system 500 may also utilize a command logic component 510, which may include or communicate with a state machine 512. In example embodiments of system 500, command logic component 510 and/or state machine 512 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

In this example, command logic component 510 is coupled to core cell array 502 using suitable interconnection elements, structure, or architecture. Command logic component 510 and state machine 512 may receive commands or instructions from a data bus connected to a system controller or the like. The commands or instructions invoke algorithms embedded in command logic component 510 and state machine 512. The algorithms perform the various tasks and processes related to programming, reading, erasing, soft programming, verifying, and other operations to be described herein. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Flash memory system 500 may also include a voltage generator component 514, which is coupled to core cell array 502, to command logic component 510, and to state machine 512. Voltage generator component 514 is controlled by command logic component 510 and/or state machine 512. Voltage generator component 514 is suitably configured to generate the necessary voltages utilized in connection with programming, reading, erasing, soft programming, and verifying of the memory cells in core cell array 502. For example, voltage generator component 514 may include or utilize one or more charge pumps, one or more voltage divider circuits, and/or one or more distinct voltage sources. Voltage generator component 514 may be designed to provide any number of fixed, variable, and/or dynamically adjustable voltage signals. As described in more detail below, voltage generator component 514 is configured to generate and apply the following to core cell array 502, without limitation: programming voltages ($V_G$) applied to the wordlines of target cells; drain bias voltages ($V_D$) applied to selectable bitlines of target cells; substrate bias voltages ($V_B$) applied to the semiconductor substrate of target cells; verification voltages applied to the wordlines of target cells; verification voltages applied to the wordline of a reference cell; and bias voltages applied to the reference cell.

Sector Selection Technologies and Techniques

Figure 6:
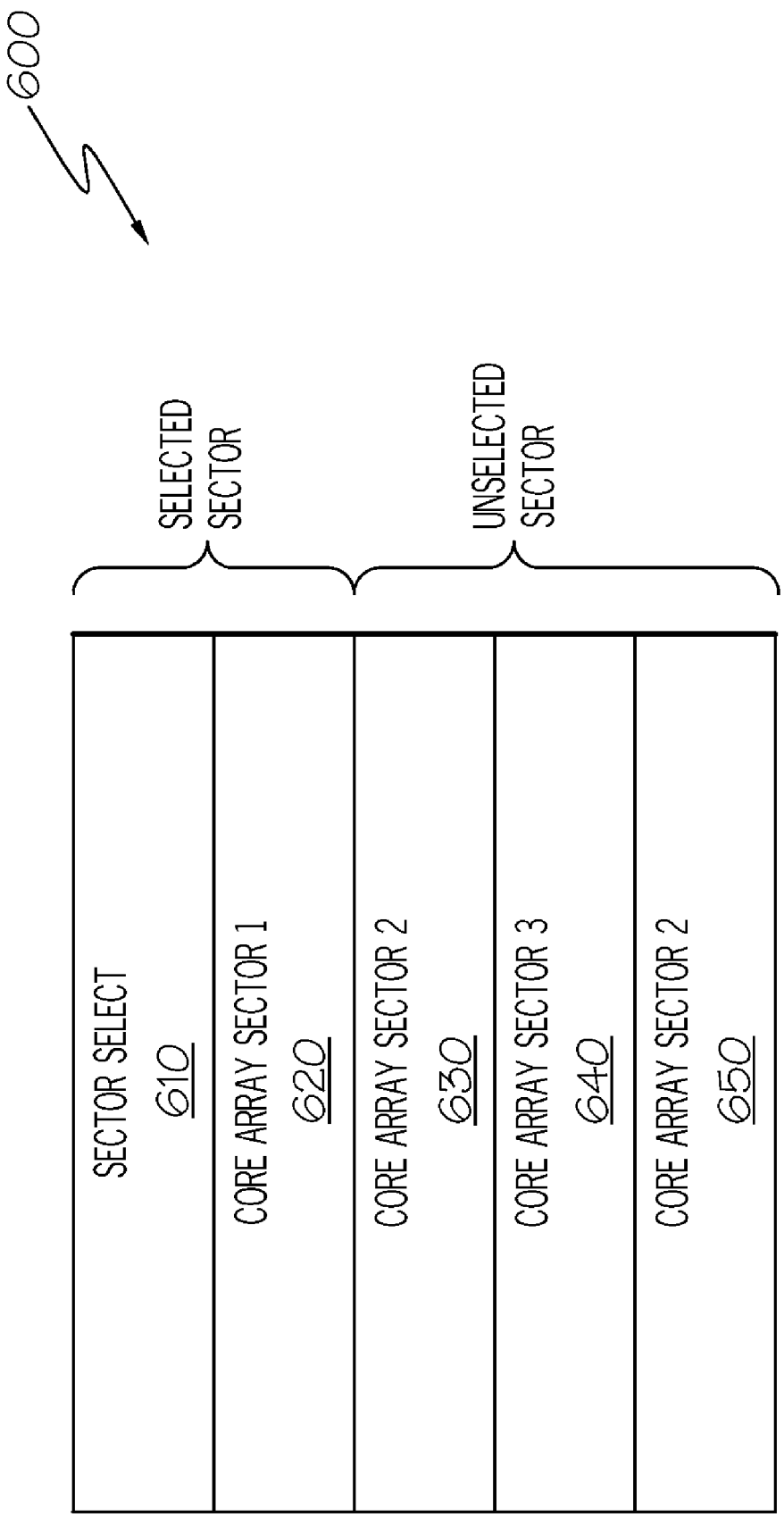
FIG. 6 is a schematic representation which shows an array of dual-bit memory cells comprising a number of core array sectors according to an exemplary embodiment.

FIG. 6 shows an array 600 of dual-bit memory cells comprising a number of core array sectors 620-650. Each of the core array sectors 620-650 comprises a number of BLs and WLs which form the dual bit memory cells as described in FIG. 2. Each core array sector 620-650 can be erased by selecting that particular sector for erasure, and applying appropriate voltages to a common P-well (not shown) in the substrate, BLs and WLs in the selected sector. Each of the core array sectors 620-650 share a single, common sector select transistor 610 that can be used to select a particular core array sector 620-650 to be erased. In other words, distinct or separate sector select transistors are not needed for each of the individual sectors.

Figure 7:
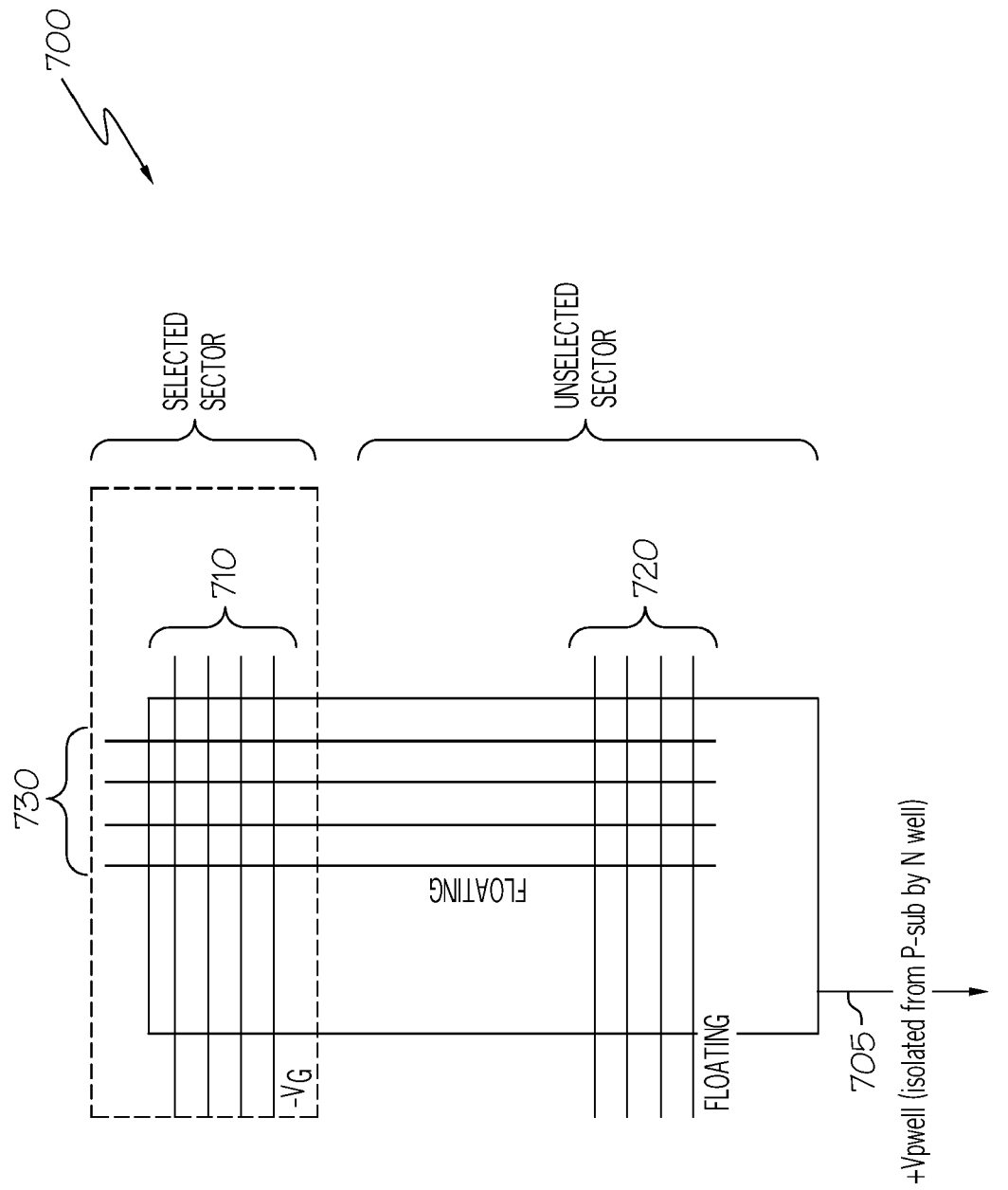
FIG. 7 is a schematic representation which shows an array of dual-bit memory cells and the biasing used to perform a channel erase operation to erase a selected sector in an array of dual bit memories cells according to an exemplary embodiment.

FIG. 7 shows an array 700 of dual-bit memory cells and the biasing used to perform a channel erase operation using Flower-Nordhiem (FN) tunneling to erase a selected sector in an array 700 of dual bit memories cells. The array 700 of dual-bit memory cells comprises a plurality of sectors. Each sector comprises a number of WLs 710, 720 and a number of BLs 730. All of the sectors share a common P-well 705. FIG. 7 shows the voltages applied to the word lines 710 in a selected sector, the word lines 720 in an unselected sector, the bit lines 730, and the common P-well 705 during the channel erase operation. To increase the efficiency of the channel erase operation each of the multiple sectors share the same P-well 705.

Each of the sectors use the same sector select transistor to select a particular sector to be erased via a channel erase operation. The sector select transistor is controlled by a logic signal in a peripheral circuit using an appropriate decoding scheme. When erasing the selected sector of the array 700, the other unselected sectors of the array 700 (which share the same sector select transistor) are biased at erase inhibit conditions such that an erase disturbance will not occur in the unselected sectors of the array 700. To achieve erase inhibit operation and allow common sector select transistor to be shared by multiple sectors, a channel erase operation can be used (opposed to a hot hole erase operation) to perform a channel erase using Fowler-Nordhiem (FN) tunneling mechanisms.

During the erase operation, the selected sector can be erased by: floating each of the BLs 730 by turning off the BLs 730 path to other portions of the circuit via a control transistor, applying a relatively high positive bias voltage ($+V_{pwell}$) (e.g., nine volts) to the common P-well 705 to all of the memory cells in the array 700, applying a negative bias voltage ($-V_G$), (e.g., minus nine volts), to each of the WLs 710 (at the respective gates of the individual transistors) in the selected sector of the array 700, and floating each of the WLs 720 in the unselected sectors of the array 700.

In one implementation, to improve the effectiveness of the FN tunneling mechanism, the charge storage regions in each of the memory cells may comprise silicon-rich nitride, polysilicon, or other equivalent charge trapping materials, such that, the dielectric stack between the substrate and control gate may comprise, for example, an oxide-silicon rich nitride-oxide (ORO) stack, an oxide-polysilicon-oxide (OPO) stack, or an oxide-silicon rich nitride-Poly-silicon rich nitride-oxide (ORPRO) stack, etc., such as those disclosed in U.S. patent application Ser. No. 11/399,158, entitled "METHODS FOR ERASING MEMORY DEVICES AND MULTI-LEVEL PROGRAMMING MEMORY DEVICE" filed Apr. 6, 2006 and assigned to the assignee of the present invention, its contents being incorporated by reference in its entirety herein. As discussed in U.S. patent application Ser. No. 11/399,158, utilizing materials such as silicon rich nitride for the charge storage layer in each of the memory cells can allow an FN erase operation to be performed since electrons in these materials are more mobile in comparison to other materials (e.g., nitride) in which the electrons fixed and less mobile. In essence, constructing the charge storage regions using materials such as silicon rich nitride makes it easier to push charge out of the charge storage regions since they have less charge trap density. Attempting to apply the same FN erase operation to a memory cell implementing, for example, nitride charge storage regions would not work since the electrons could not be pushed out of the nitride charge storage regions. By changing the composition of the charge storage layer in each of the memory cells, stored charge can be erased by applying the negative bias voltage ($-V_G$) to each of the WLs 710 (at the respective gates of the individual transistors) in the selected sector of the array 700, and the high positive bias voltage ($+V_{pwell}$) to the channel region of the device. The BLs are kept floating and will charge up to almost the same potential as the channel region. The charge stored in the charge storage layer can tunnel through the bottom tunnel oxide due to high electrical field between the WLs 710 (at the respective gates of the individual transistors) in the selected sector of the array 700 and the channel.

Each of the WLs 710 (at the respective gates of the individual transistors) is at a negative bias voltage ($-V_G$), and each of the WLs 720 (at the respective gates of the individual transistors) are left floating. Because of the bit lines 730 are N+ junctions, a forward bias couples the bit lines 730 to the common P-well 705; the bit lines 730 can charge-up very close to the relatively high positive bias voltage ($+V_{pwell}$) on the common P-well 705. In other words, the common P-well 705 and the bit lines 730 are sitting at essentially the same potential.

Applying the high positive bias voltage ($+V_{pwell}$) to the common P-well 705, couples the high positive bias voltage ($+V_{pwell}$) through the WLs 720 (at the respective gates of the individual transistors). To achieve erase inhibit, WLs 720 (at the respective gates of the individual transistors in the unselected sector of the array 700) are left floating such that the electric field between the WLs 720 (gates of the individual transistors in the unselected sector of the array 700) while the channel is kept low enough not to cause any disturbance. As such, no erase will be performed because the WLs 720 (at the respective gates of the individual transistors) in the unselected sectors of the array 700, and common P-well 705 are at the high positive bias voltage ($+V_{pwell}$). In other words, because the gates of the WLs 720 in the unselected sectors are left floating and all sectors share a common P-well 705, the selected sector can be erased without disturbing the unselected sectors since the FN field is not strong enough to erase the unselected sectors. Thus, erase operations can still be performed without the need for separate selector transistors between each of the different sectors or core array sectors in the memory array.

Figure 1:
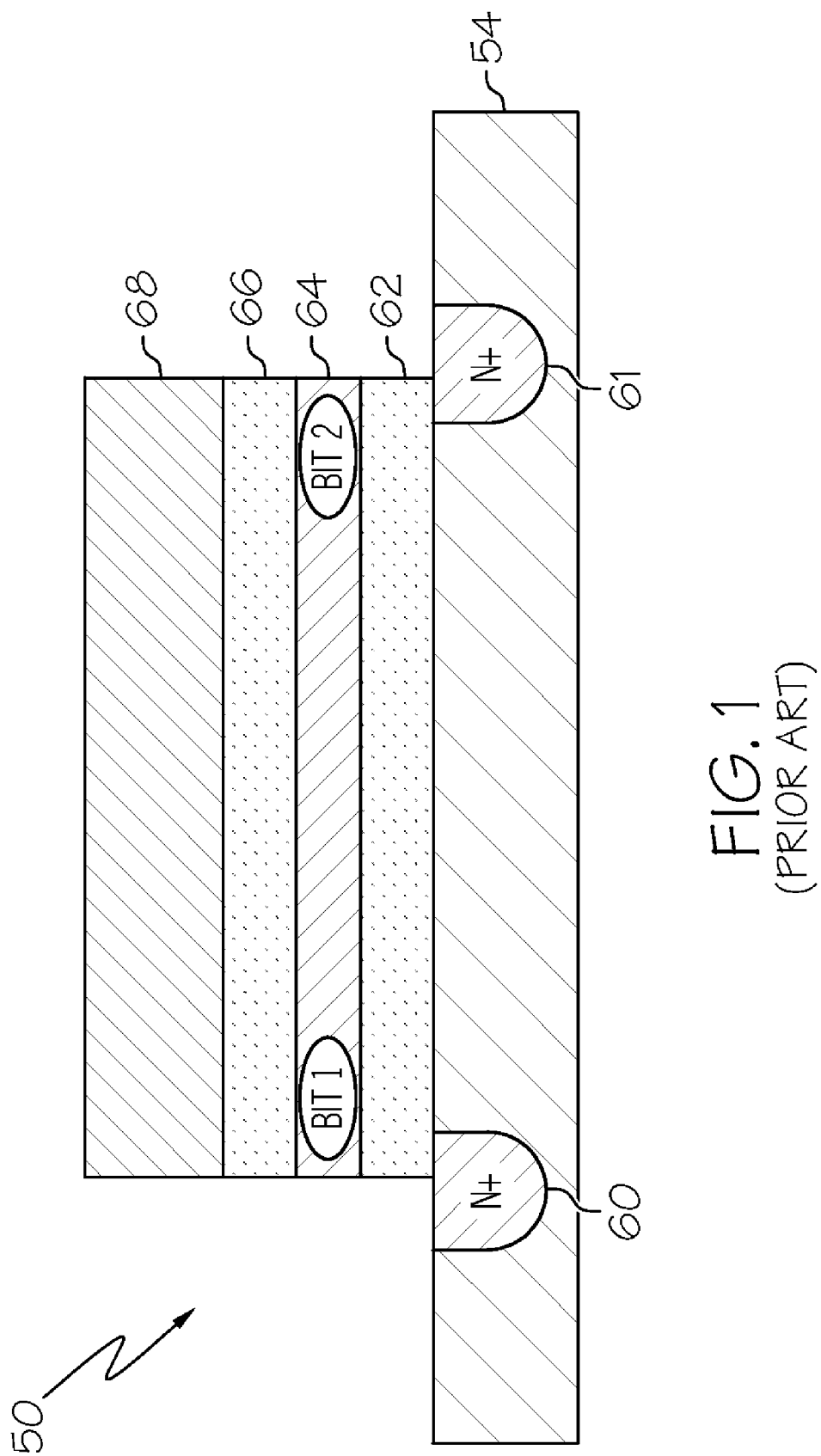
FIG. 1 is a cross sectional view of a conventional dual bit memory cell.
Figure 2:
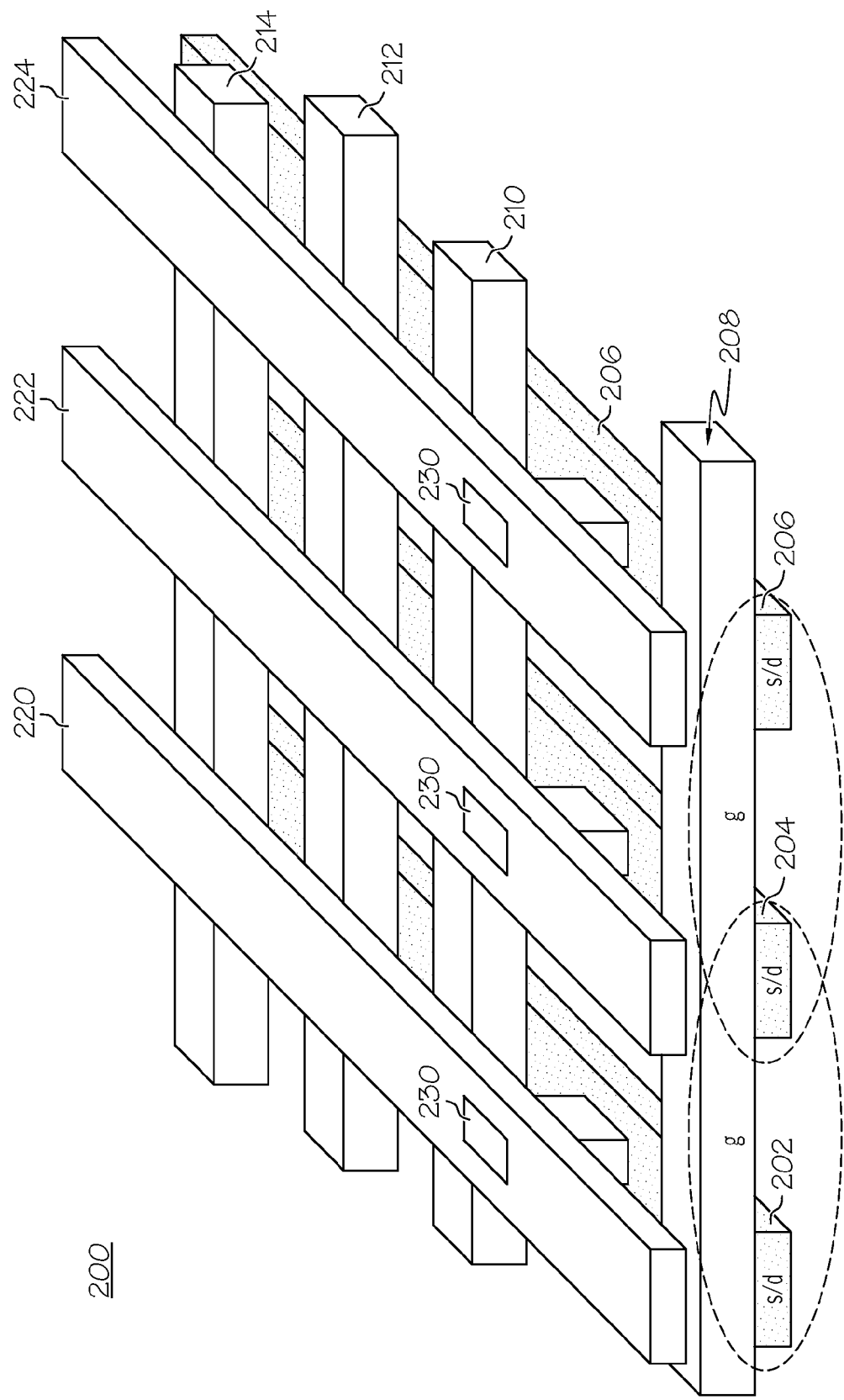
FIG. 2 is a simplified diagram of a plurality of dual bit memory cells arranged in accordance with a conventional array architecture.
Figure 3:
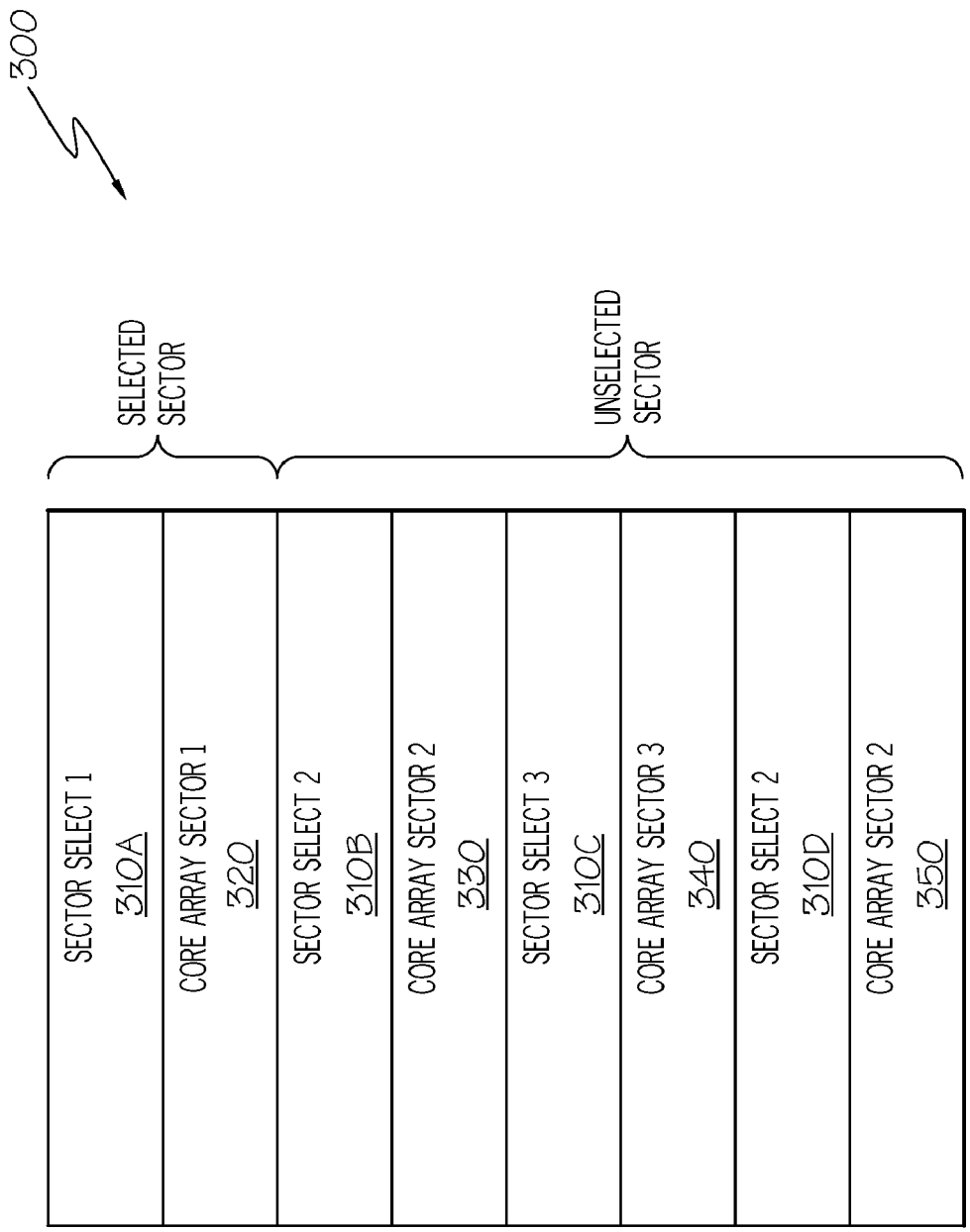
FIG. 3 is a schematic representation showing an array of dual-bit memory cells comprising a number of core array sectors.
Figure 4:
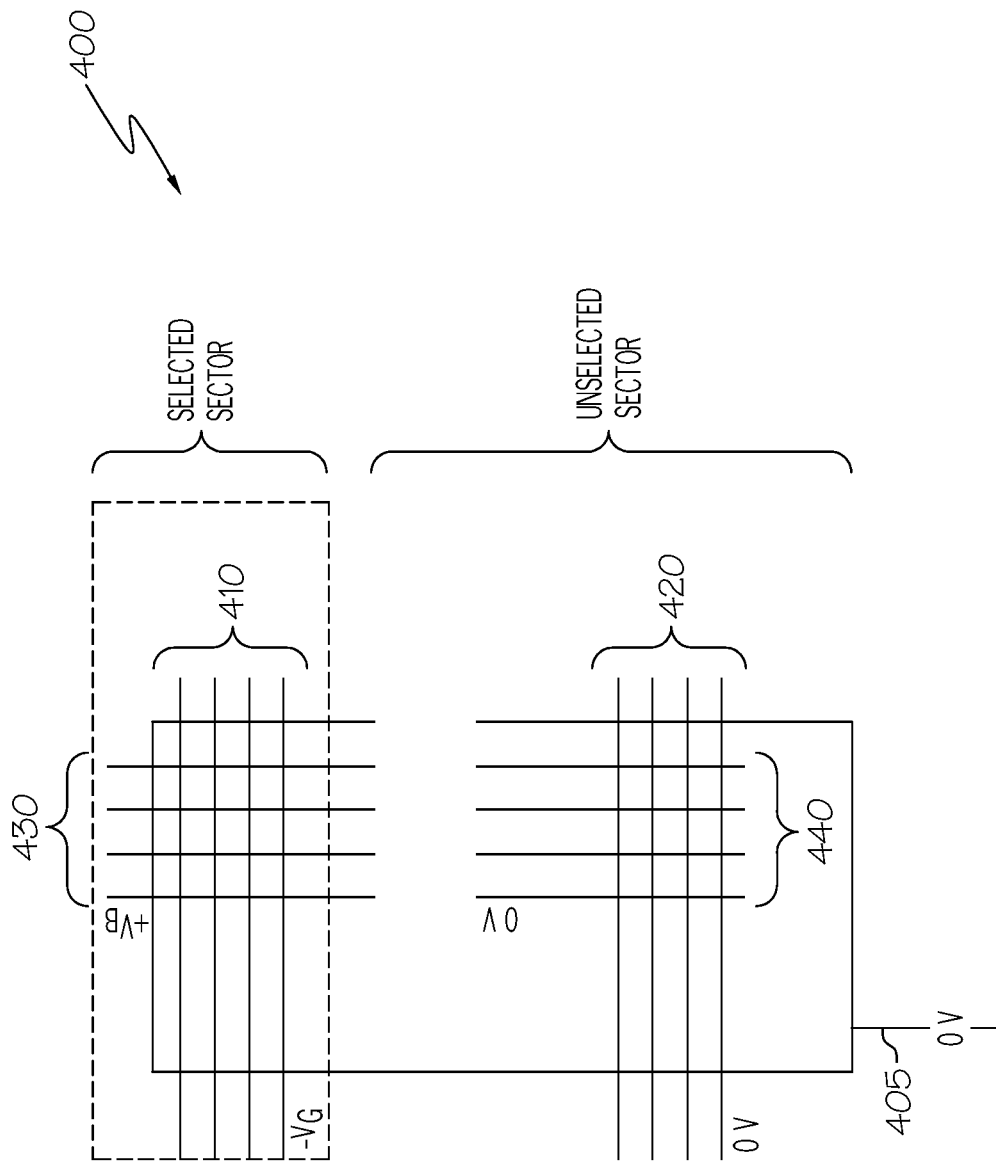
FIG. 4 is a schematic representation showing an array of dual-bit memory cells and the biasing used during a hot hole erase operation to erase a selected sector in the array.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. For example, although FIGS. 1 and 2 show a dual bit per cell memory array, the invention is not limited to dual bit per cell memory arrays; the disclosed techniques and technologies can be applied to other types of memory arrays, such as, a single bit per cell memory array or multiple bit per cell memory arrays (e.g., multilevel memory cells capable of storing more than 2 bits per cell) incorporated by reference above.

Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. A method for erasing a particular sector in a memory device, the method comprising:
    providing the memory device comprising:
        a substrate,
        a plurality of sectors,
        a single common sector selection transistor, and
        a common P-well shared by each of the sectors and being isolated from the substrate;
    selecting the particular sector of the plurality of sectors for erasure via the single common sector selection transistor; and
    applying appropriate voltages to the selected sector to erase the selected sector.

2. The method according to claim 1, wherein the memory device comprises a multiple-bit per cell memory array comprising a plurality of multiple-bit per cell memory cells.

3. The method according to claim 1, wherein the multiple-bit per cell memory array comprises a plurality of bit lines and a plurality of word lines which form multiple-bit per cell memory cells of the memory device.

4. The method according to claim 3, wherein each of the sectors comprise a subset of the plurality of multiple-bit per cell memory cells, and wherein each sector comprises the bit lines and a number of the word lines.

5. The method according to claim 4, wherein applying appropriate voltages to selected sector to erase the selected sector, further comprises:
    applying appropriate voltages to the common P-well, the bit lines and the number of word lines of the selected sector to erase the selected sector.

6. The method according to claim 5, wherein applying appropriate voltages to the common P-well, the bit lines and the number of word lines of the selected sector to erase the selected sector, further comprises:
    applying a negative bias voltage ($-V_G$), to each of the number of word lines in the selected sector of the array such that the respective gates of the individual transistors in the selected sector are negatively biased;
    floating each of the number of word lines in the unselected sectors of the array such that each of the respective gates of the individual transistors in the unselected sectors are left floating;
    floating each of the bit lines; and
    applying a positive bias voltage ($+V_{pwell}$) to all of the memory cells in the array via the common P-well.

7. The method according to claim 6, wherein each of bit lines are N+ junctions such that a forward bias couples the bit lines to the common P-well, and wherein the bit lines charge-up very close to the relatively high positive bias voltage ($+V_{pwell}$) on the common P-well such that the common P-well and the bit lines are sitting at essentially the same potential.

8. The method according to claim 6, wherein applying the high positive bias voltage ($+V_{pwell}$) to the common P-well, couples the high positive bias voltage ($+V_{pwell}$) through the word lines at the respective gates of the individual transistors in the unselected sectors.

9. The method according to claim 6, wherein the word lines in the unselected sectors of the array, and common P-well are at the high positive bias voltage ($+V_{pwell}$).

10. A memory device, comprising:
    a substrate;
    a common P-well isolated from the substrate;
    a plurality of sectors, wherein each sector comprises a plurality of bit lines and a plurality of word lines, wherein the common P-well is shared by each of the sectors; and
    a common sector selection transistor configured to select one of the sectors for erasure, wherein each of the sectors share the common sector select transistor, and wherein the selected sector is configured to be erased by applying appropriate voltages to the common P-well, the bit lines, and the word lines of the selected sector to erase the selected sector.

11. The memory device according to claim 10, wherein the memory device comprises a multiple-bit per cell memory array comprising the plurality of bit lines and the plurality of word lines which form multiple-bit per cell memory cells of the memory device.

12. The memory device according to claim 11, wherein each of the sectors comprise a subset of the plurality of multiple-bit per cell memory cells.

13. The memory device according to claim 12, wherein the plurality of sectors further comprise a plurality of unselected sectors, and wherein the selected sector is configured to be erased by:
    applying a negative bias voltage ($-V_G$), to each of the number of word lines in the selected sector of the array such that the respective gates of the individual transistors in the selected sector are negatively biased;
    floating each of the number of word lines in the unselected sectors of the array such that each of the respective gates of the individual transistors in the unselected sectors are left floating;
    floating each of the bit lines; and
    applying a positive bias voltage ($+V_{pwell}$) to all of the memory cells in the array via the common P-well.

14. The memory device according to claim 13, wherein each of bit lines are N+ junctions such that a forward bias couples the bit lines to the common P-well, and wherein the bit lines charge-up very close to the relatively high positive bias voltage ($+V_{pwell}$) on the common P-well such that the common P-well and the bit lines are sitting at essentially the same potential.

15. The memory device according to claim 13, wherein applying the high positive bias voltage ($+V_{pwell}$) to the common P-well, couples the high positive bias voltage ($+V_{pwell}$) through the word lines at the respective gates of the individual transistors in the unselected sectors.

16. The memory device according to claim 13, wherein the word lines in the unselected sectors of the array, and common P-well are at the high positive bias voltage ($+V_{pwell}$).

\* \* \* \* \*